United States Patent [19]

Christopher et al.

[11] Patent Number: 5,053,726

[45] Date of Patent: Oct. 1, 1991

[54] CIRCUIT FOR PREVENTING VCXO MODE JUMPING

[75] Inventors: Todd J. Christopher; Robert E. Morris, Jr., both of Indianapolis, Ind.

[73] Assignee: Thomson Consumer Electronics, Inc., Indianapolis, Ind.

[21] Appl. No.: 505,202

[22] Filed: Apr. 10, 1990

[51] Int. Cl.$^5$ .................... H03B 5/32; H03L 7/099
[52] U.S. Cl. ...................................... 331/34; 331/105; 331/158
[58] Field of Search ............... 331/105, 107 A, 116 R, 331/116 FE, 116 M, 154, 158, 34

[56] References Cited

U.S. PATENT DOCUMENTS

| | | | |
|---|---|---|---|
| 2,175,174 | 10/1939 | Bessemer | 331/105 |
| 2,740,048 | 3/1956 | Stricker | 331/105 |
| 2,881,316 | 4/1959 | Fisher | 331/161 |
| 3,256,498 | 6/1966 | Hurtig | 331/116 R |
| 3,324,412 | 6/1967 | Boomgaard | 331/117 R |
| 3,571,754 | 3/1971 | Healey, III et al. | 331/116 R |
| 3,699,476 | 10/1972 | Mancini | 331/116 R |
| 4,134,085 | 1/1979 | Driscoll et al. | 331/116 R |
| 4,378,532 | 3/1983 | Burgoon | 331/158 |
| 4,479,259 | 10/1984 | Fenk | 455/318 |
| 4,593,257 | 6/1986 | Wignot | 331/117 R |
| 4,621,241 | 11/1986 | Kiser | 331/117 R |
| 4,731,844 | 3/1988 | Christopher | 381/13 |
| 4,748,667 | 5/1988 | Farmer et al. | 380/7 |

Primary Examiner—Siegfried H. Grimm
Attorney, Agent, or Firm—Joseph S. Tripoli; Peter M. Emanuel; Frederick A. Wein

[57] ABSTRACT

An oscillator includes a mechanical resonator, such as a crystal, and having an amplifier arranged for oscillating at a first frequency. A resonant circuit is coupled in series with the crystal. The resonant circuit is antiresonant at an undesired harmonic frequency of the crystal thus prohibiting oscillation of the oscillator at said undesired harmonic frequency. The present oscillator is a portion of a phase locked loop used in a television receiver for demodulating a composite stereophonic audio signal.

8 Claims, 1 Drawing Sheet

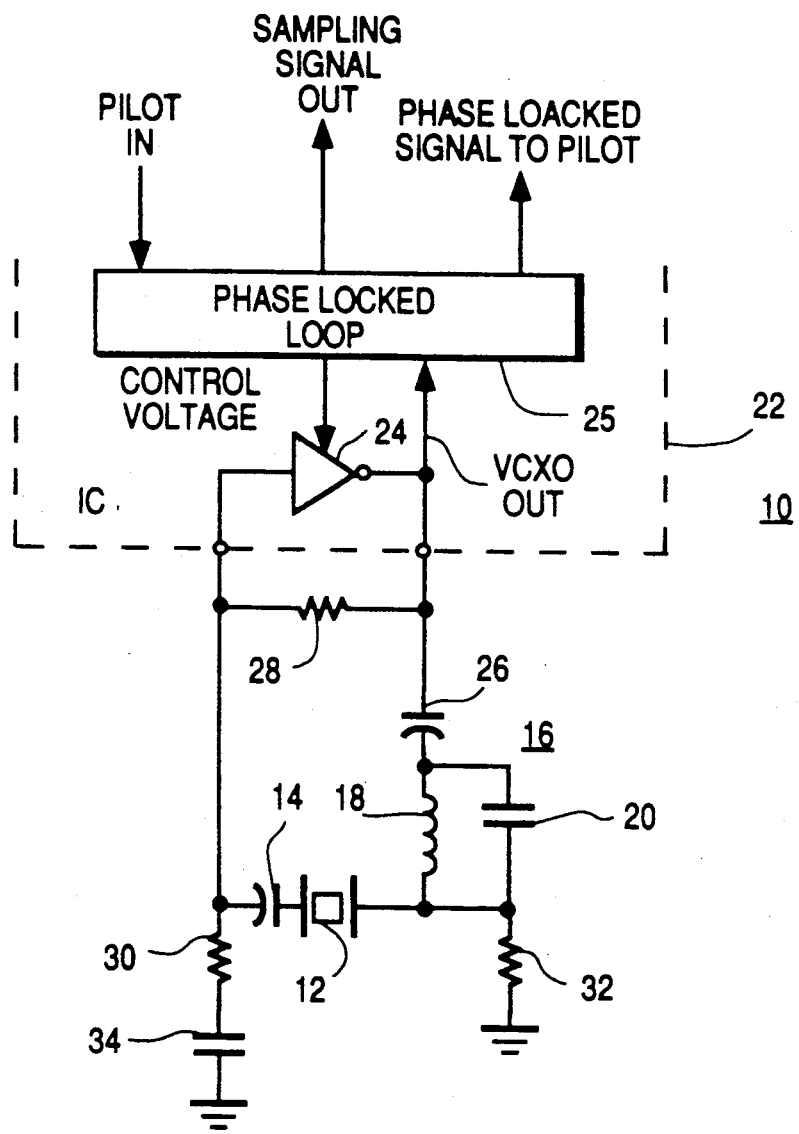

CIRCUIT FOR PREVENTING VCXO MODE JUMPING

BACKGROUND

The present invention relates to voltage controlled crystal oscillators, and more particularly, to circuitry for preventing the crystal oscillator from jumping from a desired frequency of oscillation to an undesired frequency.

Crystals, and other mechanical resonators, can be made to oscillate at a plurality of frequencies. In particular, a crystal can be cut in many different ways such that its characteristics may be chosen according to the orientation of a cut relative to the crystalline structure. For any particular cut, there is often a fundamental frequency where the crystal is antiresonant and a fundamental frequency where the crystal is series resonant. Typically a crystal oscillator will oscillate somewhere between these two fundamental frequencies where the loop gain of the oscillator is sufficiently high and has the correct phase shift for oscillation. It is also not uncommon for crystal oscillators to be designed to oscillate at a harmonic of the fundamental frequency of the crystal as determined by external circuitry.

A mechanical resonator, even when oscillating at a fundamental frequency, has some mechanical excitation at harmoic frequencies. For various reasons, such as startup instability or transients, it is possible for the mechanical resonator to oscillate at one of the harmonic frequencies above the intended oscillation frequency due to circuit components such as stray capacitances or stray inductances. Thus, the mechanical resonator can be driven to oscillate at one of the harmonic frequencies above the fundamental frequency by the external circuit, or the crystal can be resonated at parasitic harmonic frequencies by components such as stray capacitances or stray inductances.

The frequency of oscillation of a mechanical resonator is determined by external circuitry. The VCXO oscillator of the exemplary embodiment is a portion of a phase locked look (PLL) of an integrated circuit chip in a television receiver, and is a component of the digital processing apparatus of a stereophonic audio signal, as will be discussed more fully hereinafter. If the gain of the oscillator amplifier is high enough at a harmonic frequency where the phase shift of the crystal is favorable, the circuit can jump to the harmonic frequency and will establish a stable oscillation at said harmonic frequency.

As used herein, television receiver is intended to include any television signal processor such as a VCR or a monitor, with or without a display device such as a CRT.

Accordingly it is desirable to provide an economical means for assuring that a mechanical resonator oscillator will oscillate at the intended frequency and not at harmonic frequencies of the intended frequency.

SUMMARY OF THE INVENTION

Briefly, the invention concerns a mechanical resonator ciruit such as a crystal, and an amplifier configured for oscillating at an intended frequency. A parallel resonant circuit is coupled in series with the crystal with the resonant circuit being chosen to be antiresonant at an undesired harmonic frequency thus prohibiting oscillation of the mechanical resonator and the circuit at said undesired harmonic frequency. The present oscillator is a portion of a phase locked loop used in a television receiver.

BRIEF DESCRIPTION OF THE DRAWING

Reference may be had to the sole FIGURE showing a mechanical resonator oscillator constructed according to aspects of the present invention.

DETAILED DESCRIPTION OF THE PREFERRED EMBODIMENT

The voltage controlled oscillator (VCXO) of the exemplary embodiment is a portion of a phase lock loop (PLL) 25 of an integrated circuit chip utilized in a television receiver for providing a stable signal for decoding a composite audio signal including a base band L+R component, a L−R component modulated on a carrier (e.g., at 31.5 KHz), and a pilot signal (e.g., at 15.75 KHz), according to U.S. Broadcast Television Standards Committee (BTSC) specifications. The digital processing of a stereophonic audio signal used herein is disclosed in U.S. Pat. No. 4,727,333 of Dieterich for "Circuitry for Multiplying a PCM Signal by a Sinusoid" and U.S. Pat. No. 4,731,844 of Christopher for "Apparatus for Cancelling a Pilot Signal from a Composite Signal".

These patents disclose, inter alia, a phase locked loop VCXO which generates a signal which is divided down, and by action of the PLL on the VCXO, the divided down signal is phase locked to the transmitted pilot signal for demodulating the stereophonic audio signal (not shown). Herein, to achieve phase lock, the PLL can control the frequency of the VCXO over a 0.02 percent range of change. The PLL digitally multiplies a digitized version of the reference pilot signal and a digitized version of the divided down VCXO signal and couples the product through a digital low pass filter (not shown) to generate a digital PCM (pulse code modulation) phase error signal. A digital to analog converter (DAC) (not shown) generates the analog voltage level signal which is coupled to the voltage control input of the VCXO oscillator amplifier for voltage controlling the frequency of the oscillator. The VCXO signal, thus phase locked to the pilot signal, is also used as the sampling clock signal coupled to an analog to digital converter (not shown) for converting the analog composite signal to a digital version of the composite signal for digital processing.

The exact frequency of oscillation of a mechanical resonator is determined by external circuitry. The crystal acts as a bandpass filter wherein the phase shift quickly varies for small frequency changes. The circuit will operate where the phase is substantially zero phase shift or N times 360 degrees of phase shift. A crystal will usually have zero phase shift at the fundamental frequency and odd harmonics of the fundamental frequency, e.g., 3rd, 5th, 7th harmonics. If the sensitivity of the oscillator amplifier to voltage control input signals or to transients is sufficiently high at the odd harmonic frequencies such that the loop gain is greater than one, the oscillator is capable of oscillating at such a harmonic frequency of the crystal and the circuit can jump to the harmonic frequency and establish an undesired stable oscillation at said harmonic frequency. When such a jumped mode of oscillation takes place, the jump is of such a great magnitude that it is out of the pull-in range of the PLL which as stated above is about 0.02 percent. Thus, the PLL error signal applied to the VCXO cannot correct the false lock and other measures must be taken to prevent such an event. The present invention is directed for preventing such a mode jumping change of the frequency of oscillation to such an undesired harmonic frequency.

Specifically, in the sole figure, there is shown a voltage control crystal oscillator (VCXO), generally designated 10, having a crystal 12, a capacitance 14 coupled in series with crystal 12 for resonating therewith at an intended frequency, and a parallel antiresonant circuit 16, comprising an inductance 18 and a capacitance 20, coupled in series with crystal 12. The crystal circuit is coupled to integrated circuit 22 having therein an amplifier 24 which in the exemplary embodiment is part of a phase locked loop 25.

Crystal 12 and capacitance 14 provide for oscillation at an intended frequency. As a typical arrangement, crystal 12 and capacitance 14 are coupled across amplifier 24 in an oscillatory manner such that the gain and phase shift of the loop are favorable for oscillation.

As stated above, it is possible for mechanical resonators such as crystals to oscillate at other than the fundamental frequency of the crystal if the phase shift and gain around the loop at the harmonic frequencies are favorable for oscillation. To prevent such "mode jumping", according to aspects of the present invention, parallel tuned circuit 16, comprising inductance 18 and capacitance 20, is coupled in series with crystal 12. Resonant circuit 16 is antiresonant or a high impedance at the harmonic frequency where oscillation is to be prevented, which in the present embodiment is the third harmonic of the intended frequency. Antiresonant circuit 16, which provides a very high series circuit impedance at the harmonic frequency thus greatly reducing the loop gain and changing the phase shift so that oscillation at the harmonic frequency will not take place. In the prior art, a low-pass filter has been traditionally used for the purpose of reducing the loop gain at the higher harmonic frequency so that oscillation cannot be sustained. However, it has been found that circuit 16 provides even greater attenuation at the harmonic frequency than such a low-pass filter (of the order of greater than 15–20 db), which is more than is practicable with a low-pass filter without adversely effecting oscillation at the fundamental oscillation frequency as would be the case with a low-pass filter. This high attenuation is particularly helpful if the VCXO amplifier has a wide bandwidth and still has substantial gain at the odd harmonic frequencies.

Since a parallel resonant circuit is inductive at frequencies lower than the frequency of resonance, a capacitance 26 is coupled in series with circuit 16 to resonate with the inductance of circuit 16 at the lower intended oscillation frequency thus removing circuit 16 from the circuit at the intended frequency.

Resistors 28, 30, and 32 and capacitor 34 provide DC bias and impedance couplings to ground as required for the operation of amplifier 24 of integrated circuit 22.

What is claimed is:

1. A mechanical resonator oscillator circuit having mode jumping prevention comprising:
   an amplification means,
   a mechanical resonator means coupled to the amplification means in an oscillatory manner for generating an oscillatory signal at a first frequency as determined by the mechanical resonator; the mechanical resonator having a plurality of possible oscillatory frequencies,
   a resonant circuit means coupled to said mechanical resonator means and said amplification means for preventing oscillation of the oscillator circuit at an undesired one of said plurality of oscillatory frequencies, the resonant circuit means being a parallel resonant circuit coupled in series with the mechanical resonator means, and
   a reactance means for resonating with the resonant circuit means at the first frequency.

2. The oscillator circuit of claim 1 wherein the undesired one of said plurality of mechanical oscillatory frequencies is a third harmonic of the first frequency.

3. A mechanical resonator oscillator circuit having mode jumping prevention comprising:
   an amplification means,
   a mechanical resonator means coupled to the amplification means in an oscillatory manner for generating an oscillatory signal at a first frequency as determined by the mechanical resonator, the mechanical resonator having a plurality of possible oscillatory frequencies,
   a resonant circuit means coupled to said mechanical resonator means and said amplification means for preventing oscillation of the oscillator circuit at an undesired one of said plurality of oscillatory frequencies, and,
   a reactance means for resonating with the resonant circuit means at the first frequency,
   the oscillator circuit comprising a portion of a phase locked loop.

4. The oscillator circuit of claim 1 wherein the reactance means series resonates with the resonant circuit means at the first frequency.

5. A mechanical resonator oscillator circuit having mode jumping prevention comprising:
   an amplification means,
   a mechanical resonator means coupled to the amplification means in an oscillatory manner for generating an oscillatory signal at a first frequency as determined by the mechanical resonator, the mechanical resonator having a plurality of possible oscillatory frequencies,
   a resonant circuit means coupled in series with said mechanical resonator means and said amplification means for preventing oscillation of the mechanical resonator at an undesired one of said plurality of oscillatory frequencies, said resonant circuit comprising a parallel resonant circuit resonant at an undesired one of said plurality of oscillatory frequencies, and
   a reactive impedance means coupled in series with the resonant circuit means for series resonating with the resonant circuit means at the first frequency.

6. A VCXO oscillator circuit in a phase locked loop having mode jumping prevention comprising
   an amplification means, the amplification of said amplification means being responsive to a control voltage,
   a phase locked loop responsive to a pilot signal and providing the control voltage coupled to the amplification means,
   a mechanical resonator coupled to the amplification means in an oscillatory manner for generating an oscillatory signal at a first frequency as determined by the mechanical resonator and the amplification means in response to the control voltage so that the oscillatory signal is phase locked to the pilot signal, the mechanical resonator having a plurality of possible oscillatory frequencies including harmonics of the first frequency, a resonant circuit means coupled to said mechanical resonator and said amplification means for preventing oscillation of the oscillator circuit at a harmonic of the first frequency, said resonant circuit comprising a parallel resonant circuit resonant at one of said harmonics of said first frequency, and a reactance means for resonating with the resonant circuit means at the first frequency.

7. A television receiver having a digital audio system including a VCXO oscillator circuit in a phase locked loop having mode jumping prevention comprising:

a television receiver having digital processing means for processing a stereophonic audio signal including amplification means and a phase locked loop, the amplification of said amplification means being responsive to a control voltage, the phase locked loop being responsive to a pilot signal included in said stereophonic audio signal and providing the control voltage coupled to the amplification means so as to provide an oscillatory signal phase locked to the pilot signal, a mechanical resonator coupled to the amplification means in an oscillatory manner for generating an oscillatory signal at a first frequency as determined by the mechanical resonator and the amplification means in response to the control voltage so that the oscillatory signal is phase locked to the pilot signal, the mechanical resonator having a plurality of possible oscillatory frequencies at harmonics of the first frequency, a resonant circuit means coupled to said mechanical resonator means for preventing the oscillator circuit from oscillating at one of the harmonics of the first frequency, said resonant circuit comprising a parallel resonant circuit resonant at said one of the harmonics of said first frequency, and a reactance means for resonating with the resonant circuit means at the first frequency.

8. A mechanical resonator oscillator circuit having mode jumping prevention comprising:

an amplification means, a mechanical resonator means coupled to the amplification means in an oscillatory manner for generating an oscillatory signal at a first frequency, the mechanical resonator having a plurality of possible oscillatory frequencies, a first resonance means coupled to said mechanical resonator means for preventing the oscillator circuit from oscillating at an undesired one of said plurality of oscillatory frequencies, and a second resonance means coupled to the first resonance means for resonating with the first resonance means at the first frequency.

* * * * *